(12) United States Patent
Iijima (10) Patent No.: US 8,673,690 B2
(45) Date of Patent: Mar. 18, 2014

(54) METHOD FOR MANUFACTURING A SEMICONDUCTOR DEVICE AND A SEMICONDUCTOR DEVICE

(75) Inventor: Toshitsune Iijima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 398 days.

(21) Appl. No.: 13/039,663

(22) Filed: Mar. 3, 2011

(65) Prior Publication Data

US 2011/0215461 A1 Sep. 8, 2011

(30) Foreign Application Priority Data

Mar. 5, 2010 (JP) ................................. 2010-049348

(51) Int. Cl.
*H01L 21/44* (2006.01)
*H01L 21/48* (2006.01)

(52) U.S. Cl.
USPC ........... 438/124; 438/127; 438/110; 438/113; 257/737; 257/E21.502

(58) Field of Classification Search
USPC .......... 257/787, E21.502; 438/110, 113, 124, 438/127
See application file for complete search history.

(56) References Cited

U.S. PATENT DOCUMENTS

| | | | | |
|---|---|---|---|---|
| 5,976,912 A | * | 11/1999 | Fukutomi et al. | 438/110 |
| 5,989,982 A | * | 11/1999 | Yoshikazu | 438/462 |
| 6,001,671 A | * | 12/1999 | Fjelstad | 438/112 |
| 6,004,867 A | * | 12/1999 | Kim et al. | 438/459 |
| 6,590,291 B2 | * | 7/2003 | Akagawa | 257/774 |
| 7,193,301 B2 | | 3/2007 | Yamaguchi | |
| 2004/0173894 A1 | * | 9/2004 | Glenn et al. | 257/693 |
| 2010/0213599 A1 | | 8/2010 | Watanabe et al. | |

FOREIGN PATENT DOCUMENTS

| | | |
|---|---|---|
| JP | 2004-56012 | 2/2004 |
| JP | 2006-222164 | 8/2006 |
| JP | 2009-27127 | 2/2009 |
| TW | 201001632 A | 1/2010 |

OTHER PUBLICATIONS

Notification of Reasons for Refusal issued by the Korean Intellectual Property Office on Aug. 31, 2012, for Korean Patent Application No. 10-2011-0018952.
English-language translation of Notification of Reasons for Rejection issued by the Japanese Patent Office on May 22, 2012, for Japanese Patent Application No. 2010-049348.
First Office Action issued by the Chinese Patent Office on Jan. 25, 2013, for Chinese Patent Application No. 201110052233.2, and English-language translation of text thereof.
Taiwanese Office Action dated Aug. 30, 2013 for Taiwanese Patent Application No. 100105095 (3 pages).

* cited by examiner

*Primary Examiner* — Nitin Parekh
(74) *Attorney, Agent, or Firm* — Finnegan, Henderson, Farabow, Garrett & Dunner, L.L.P.

(57) ABSTRACT

A method for manufacturing a semiconductor device according to one embodiment of the present invention includes a step of covering a plurality of base plates in which respective semiconductor chips are mounted, by means of a sealing resin such that a plurality of base plates are spaced apart from each other, and a step of cutting the sealing resin between a plurality of base plates.

7 Claims, 8 Drawing Sheets

METHOD FOR MANUFACTURING A SEMICONDUCTOR DEVICE AND A SEMICONDUCTOR DEVICE

CROSS REFERENCE TO RELATED APPLICATIONS

This application is based upon and claims the benefit of priority from the prior Japanese Patent Application No. 2010-049348 filed in Japan on Mar. 5, 2010; the entire contents of which are incorporated herein by reference.

FIELD

Embodiments described herein relate generally to a method for a manufacturing a semiconductor device and a semiconductor device in which a semiconductor chip and a base plate are sealed by a resin.

BACKGROUND

As conventional semiconductor devices, a semiconductor device is known in which a semiconductor chip and a base plate are sealed by a sealing resin. A method is studied for manufacturing a plurality of semiconductor devices easily at low cost by collectively forming a plurality of these semiconductor devices. This method will be described in detail below.

First, the lower surfaces of a plurality of semiconductor chips are pasted on a tool. Next, a sealing resin is formed on the tool including all of a plurality of semiconductor chips. By this means, individual semiconductor chips are sealed by the sealing resin. Next, the sealing resin is removed such that the upper surface of each semiconductor chip is exposed, and one base plate is pasted on the sealing resin including the upper surfaces of a plurality of semiconductor chips. Then, the tool is peeled off from the assembly of a plurality of semiconductor chips which is integrated by the sealing resin and base plates, and wiring patterns, solder resist film and BGA balls are collectively formed in the lower surface of each semiconductor chip. Finally, the sealing resin and base plates are cut by a method such as dicing, to individually divide semiconductor devices.

In addition, with this description, collective formation of a plurality of the above semiconductor devices means collectively sealing a plurality of semiconductor chips by means of a resin, collectively forming, for example, wiring patterns and then cutting the resin to form a plurality of semiconductor devices.

However, with the above method of collectively forming a plurality of conventional semiconductor devices, particularly when base plates made of a material harder than a resin such as a metal or ceramic, are applied, it is difficult to cut the base plates in the final shaving and cutting step. Therefore, there is a problem that the shaving and cutting step causes damages such as cutting burrs in wiring patterns and solder resist film, thereby decreasing the yield of devices.

DETAILED DESCRIPTION

The method for a manufacturing a semiconductor device according to one embodiment includes: a step of pasting a plurality of base plates to a support body; a step of forming a sealing resin; a step of forming wiring patterns; a step of forming wiring protective film; a step of forming external electrodes; a step of cutting the sealing resin and the wiring protective film; and a step of peeling off from the support body the semiconductor chips and the base plates covered by the sealing resin. The step of pasting to the support body a plurality of base plates includes a step of pasting to the support body a plurality of base plates on which respective semiconductor chips are mounted, at a predetermined interval. The step of forming the sealing resin includes a step of forming the sealing resin in the support body such that the sealing resin covers a plurality of base plates and a plurality of semiconductor chips. The step of forming the wiring patterns includes a step of forming the wiring patterns in the sealing resin such that the wiring patterns are electrically connected to the respective semiconductor chips. The step of forming the wiring protective film includes a step of forming the wiring protective film in the sealing resin including the wiring patterns such that part of the wiring patterns are exposed. The step of forming the external electrodes includes a step of forming the external electrodes such that the external electrodes contact the wiring patterns exposed from the wiring protective film.

Hereinafter, the method for manufacturing the semiconductor device and a semiconductor device formed by the method according to embodiments will be described with reference to the drawings.

First Embodiment

Figure 1:
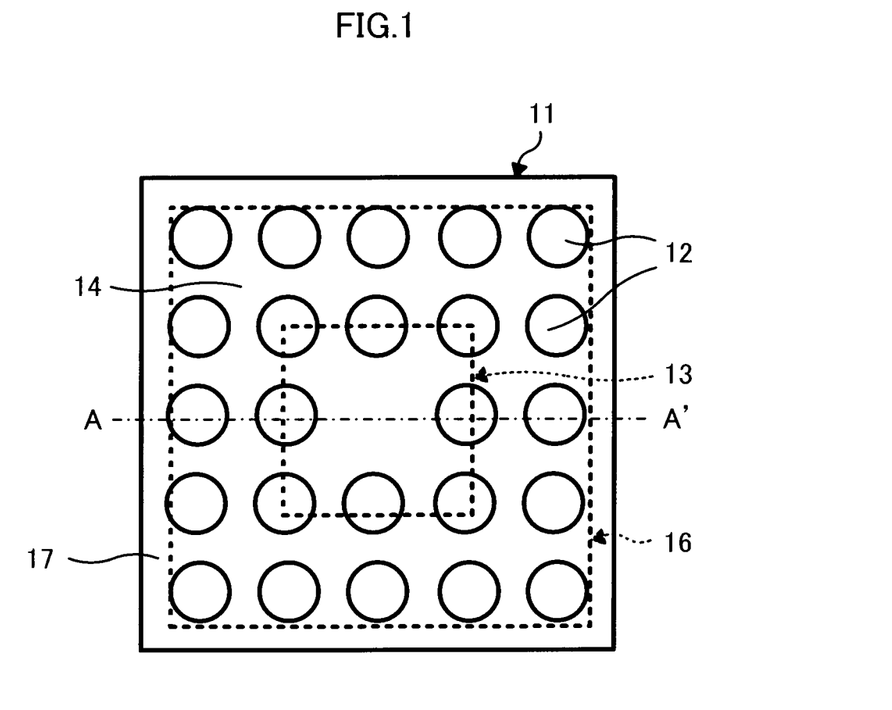
FIG. 1 is a plan view showing from a lower surface side a semiconductor device formed by a method for manufacturing a semiconductor device according to the first embodiment of the present invention.
Figure 2:
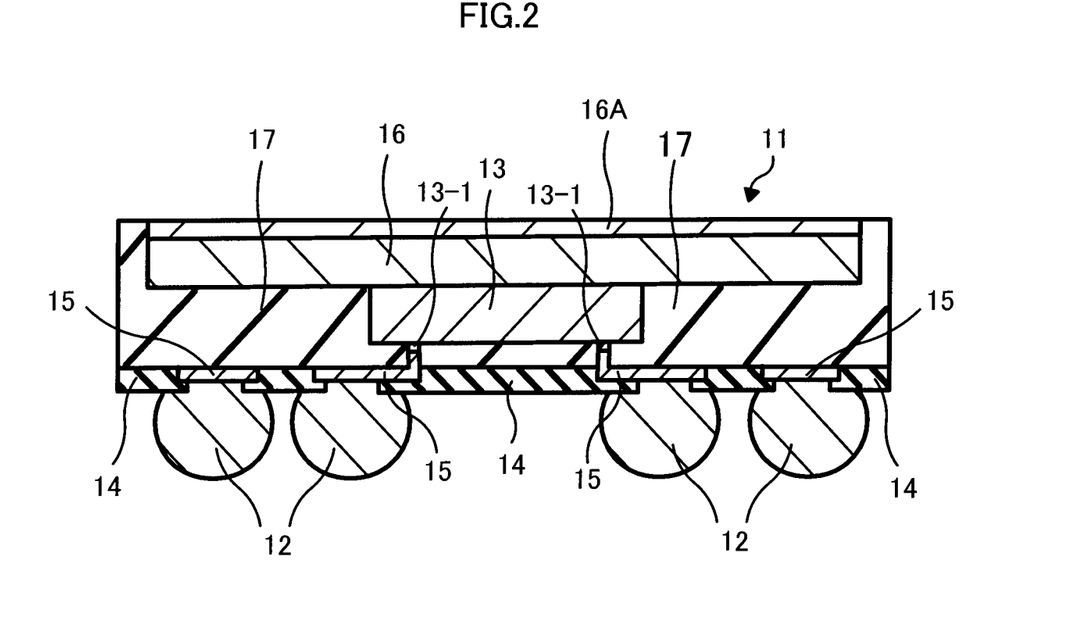
FIG. 2 is a sectional view along a dashed line A-A' of FIG. 1.

FIG. 1 is a plan view showing from a lower surface side a semiconductor device formed by a method for manufacturing a semiconductor device according to the first embodiment of the present invention. FIG. 2 is a sectional view along a dashed line A-A' of FIG. 1.

A semiconductor device 11 illustrated in FIG. 1 has a semiconductor chip 13 (FIG. 2) inside. The semiconductor device 11 has a plurality of BGA (Ball Grid Array) balls 12 in a grid pattern in the lower surface of the device 11. The BGA balls 12 serve as external electrodes of the device 11. Consequently, the semiconductor chip 13 (FIG. 2) is electrically connected to wirings on a mounting substrate, which is not illustrated, through the BGA balls 12.

The lower surface of the device 11 means the surface in which the BGA balls 12 of the semiconductor device 11 are formed, and the upper surface means the surface which opposes the lower surface of the semiconductor device 11. The "above" of the semiconductor device 11 means the upper side of the upper surface, and the "below" of the semiconductor device 11 means the lower side of the lower surface. Hereinafter, each meaning of the upper surface, lower surface, above and below of the semiconductor device 31, semiconductor chip 13, base plate 16, sealing resins 17, 32 and 41 and support film 18 and 51 will follow each of upper and lower directions of the semiconductor device 11.

The area in the lower surface of the device 11 other than BGA balls 12 is covered by solder resist film 14. The solder resist film 14 is a resin which functions as a wiring protective film for protecting wiring patterns 15 (FIG. 2) described below, and, at the same time, functions as an insulating film for insulating a part of the wiring patterns 15 and BGA balls 12.

As illustrated in FIG. 2, the semiconductor device 11 is a device in which the semiconductor chip 13 and the base plate 16 are sealed by the sealing resin 17. The sealing resin 17 covers lateral surfaces and a lower surface of the base plate 16 and semiconductor chip 13. The sealing resin 17 is made of, for example, a material such as an epoxy resin.

The semiconductor chip 13 is, for example, a high frequency semiconductor chip or a high-power semiconductor chip. In the lower surface of the semiconductor chip 13, external electrodes 13-1 such as stud bumps are formed. The planar shape of the semiconductor chip 13 is a square shape of, for example, a 2 mm to 10 mm side.

The base plate 16 is formed such that part of the lower surface of the base plate 16 contacts the upper surface of the semiconductor chip 13. The base plate 16 is formed in a size larger than the semiconductor chip 13, and the planar shape of the base plate 16 is a square shape of, for example, 5 mm to 15 mm side. In addition, the base plate 16 is preferably made of a material of good thermal conductivity such as a stainless-steel, copper or ceramic. The base board 16 that is made of the material of good thermal conductivity serves as a heat sink.

In case the base plate 16 is made of a corrosion-prone material such as a copper, for example, gold plating processing is preferably applied to the upper surface of the base plate 16 to form a plated layer 16A.

In the lower surface of the sealing resin 17, the wiring patterns 15 are formed. At least part of the wiring patterns 15 are connected to the external electrodes 13-1 such as stud bumps formed in the lower surface of the semiconductor chip 13. The semiconductor chip 13 and at least part of wiring patterns 15 are electrically conducted through the external electrodes 13-1. In addition, although not illustrated, part of the wiring patterns 15 are formed outside the peripheral part of the semiconductor chip 13.

The wiring patterns 15 are covered by the solder resist film 14. The solder resist film 14 has openings in areas in which the BGA balls 12 are formed. The BGA balls 12 are formed in the openings of the solder resist film 14, so that the wiring patterns 15 and BGA balls 12 are electrically conducted.

In addition, with the above semiconductor device 11, the surfaces of the wiring patterns 15 may be covered by thin film (not illustrated) such as gold to suppress oxidation. Further, metal diffusion prevention processing may be applied to areas on the surfaces of the wiring patterns 15 which contact the BGA balls 12.

Figure 3:
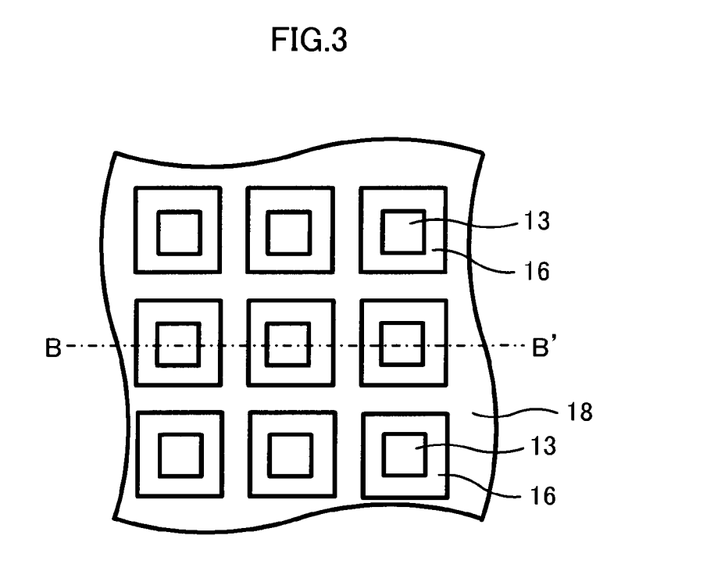
FIG. 3 is a view showing manufacturing step of the semiconductor device illustrated in FIG. 1 and FIG. 2, and a plan view showing from a lower surface side the semiconductor devices.

Next, a method for manufacturing semiconductor devices 11 including the semiconductor chips 13 and base plates 16 described above will be described. This method includes mounting the respective semiconductor chips 13 on a plurality of base plates 16 individually divided in advance and then sealing the entire assembly, and forming the wiring patterns 15 and then individually dividing devices 11. Hereinafter, this method will be described with reference to FIG. 3 to FIG. 11. FIG. 3 is a view showing manufacturing step of the semiconductor device 11 illustrated in FIG. 1 and FIG. 2, and a plan view showing from a lower surface side the semiconductor devices 11. FIG. 4 to FIG. 11 are views showing steps for manufacturing the semiconductor device illustrated in FIG. 1 and FIG. 2, and sectional views of semiconductor devices along a dashed line B-B' in FIG. 3.

Figure 4:
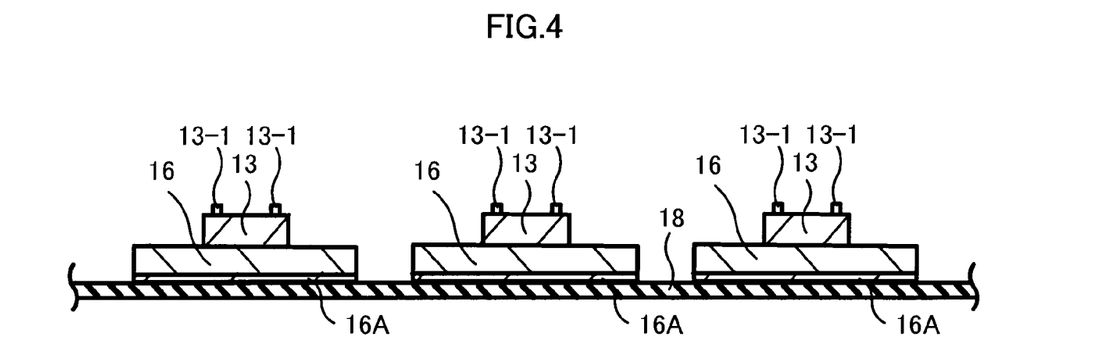
FIG. 4 is a view showing step for manufacturing the semiconductor device illustrated in FIG. 1 and FIG. 2, and a sectional view of semiconductor devices along a dashed line B-B' in FIG. 3.

First, as illustrated in FIG. 3 and FIG. 4, a plurality of base plates 16 individually divided to match the predetermined outer dimensions of the semiconductor devices 11 are prepared. Then, the semiconductor chip 13 is mounted on the lower surface of each base plate 16. The semiconductor chip 13 is mounted on the lower surface of the base plate 16 as follows.

First, a pasty or liquid adhesive material (not illustrated) is supplied to the lower surface of the base plate 16 or the upper surface of the semiconductor chip 13. Next, the position of the semiconductor chip 13 with respect to the base plate 16 is adjusted to the desired position. After the position of the semiconductor chip 13 is adjusted, the base plate 16 and semiconductor chip 13 are pasted together. Thus, the semiconductor chip 13 is mounted on the lower surface of the base plate 16.

After the semiconductor chip 13 is mounted on the lower surface of the base plate 16, the upper surface of each base plate 16 on which the semiconductor chip 13 is mounted is pasted to the lower surface of a support body formed with the support film 18, at a substantially equal interval.

The support film 18 is preferably a tape material which has an adhesiveness. The support film is preferably made of a material (for example, polyethylene or polyester) having chemical resistance against the photolithography technique adopted in the step illustrated in FIG. 7 described below, particularly, against an etching liquid. However, the support body is not necessarily the support film 18 of a film shape, and a support plate which has virtually the same function as the support film 18 may be adopted.

Figure 5:
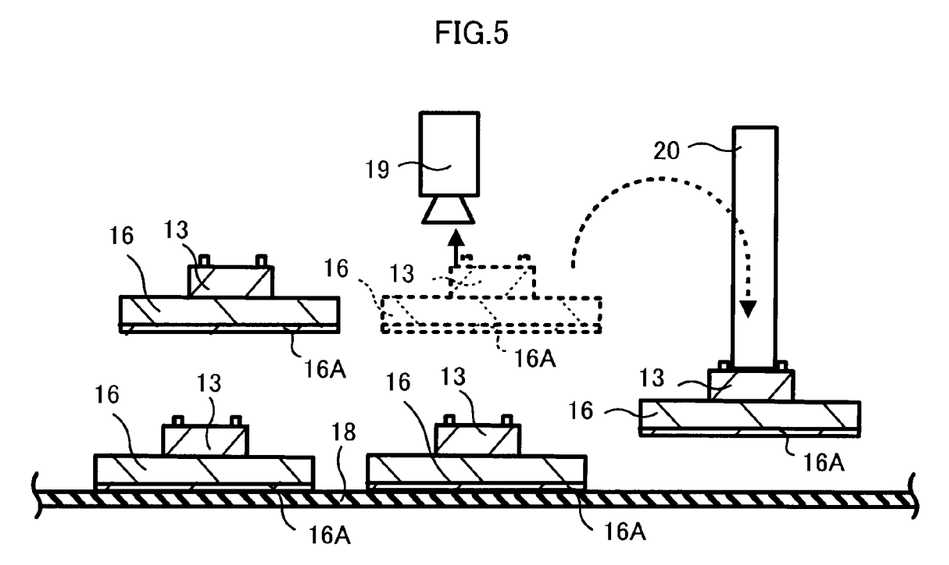
FIG. 5 is a sectional view more specifically illustrating the method shown in FIG. 4.

The step of pasting the base plate 16 to the support film 18 is performed as illustrated in, for example, FIG. 5. First, an alignment mark (not illustrated) provided in the semiconductor chip 13 is recognized by, for example, a mark recognition camera 19. Next, the semiconductor chips 13 having alignment marks recognized are picked up by, for example, a pick up device 20. Next, each semiconductor chip 13 is positioned with respect to the support film 18 such that the alignment marks of each semiconductor chip 13 are at equal intervals, and is pasted.

Figure 6:
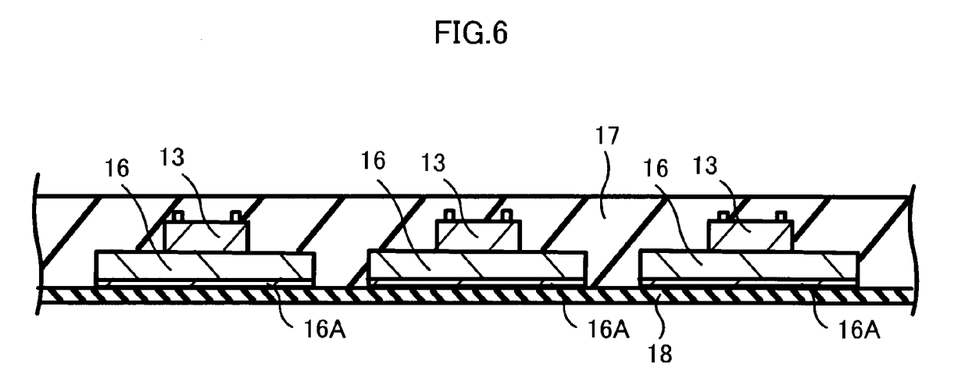
FIG. 6 is a view showing step for manufacturing the semiconductor device illustrated in FIG. 1 and FIG. 2, and a sectional view of semiconductor devices along a dashed line B-B' in FIG. 3.

Next, as illustrated in FIG. 6, the sealing resin 17 is formed in the lower surface of the support film 18 including a plurality of semiconductor chips 13 and a plurality of base plates 16. The sealing resin 17 integrates a plurality of semiconductor chips 13 and a plurality of base plates 16. For example, a photosensitive insulation film made of an epoxy resin is used for the sealing resin 17.

Figure 7:
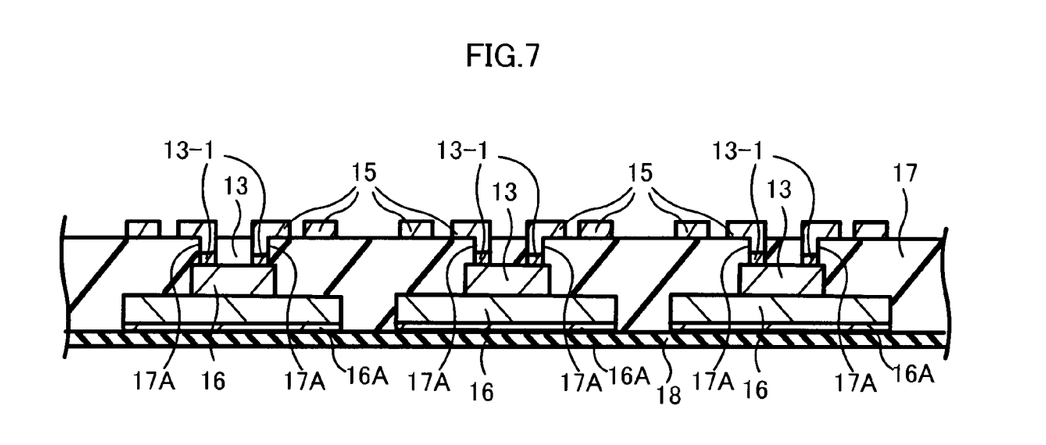
FIG. 7 is a view showing step for manufacturing the semiconductor device illustrated in FIG. 1 and FIG. 2, and a sectional view of semiconductor devices along a dashed line B-B' in FIG. 3.

Next, as illustrated in FIG. 7, openings 17A that expose the external electrodes 13-1 of the semiconductor chips 13 are formed to the sealing resin 17. The openings 17A are formed using, for example, the photolithography technique.

After the openings 17A are formed, the wiring patterns 15 are formed in the lower surface of the sealing resin 17. At least part of the wiring patterns 15 are connected to the external electrodes 13-1 of the semiconductor chips 13. The wiring patterns 15 are formed, for example, as follows. First, the metal layer which becomes the wiring patterns 15 are grown on the lower surface of the sealing resin 17 according to, for example, the plating method. Next, the wiring patterns 15 are formed by adopting the photolithography technique to the metal layer.

The photolithography technique means a series of steps described below. First, a photoresist layer is formed on the sealing resin 17 or the metal layer. Next, the photoresist layer is exposed using the mask including a desired opening pattern. Next, the exposed photoresist layer is developed. Next, the sealing resin 17 or the metal layer is etched using the developed photoresist layer as the mask. The photolithography technique means a series of steps described below.

In addition, although not illustrated, when wiring patterns are formed in multiple layers, the step illustrated in FIG. 7 only needs to be repeated if necessary.

Figure 8:
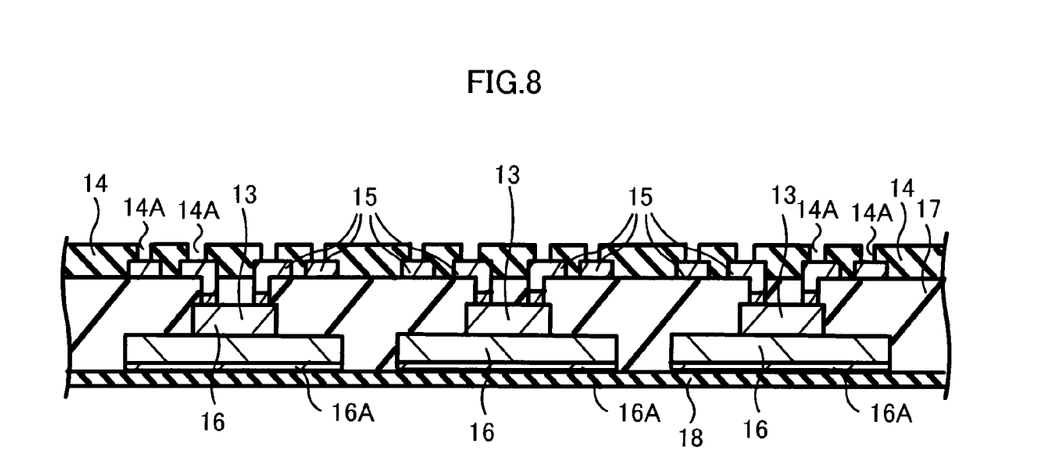
FIG. 8 is a view showing step for manufacturing the semiconductor device illustrated in FIG. 1 and FIG. 2, and a sectional view of semiconductor devices along a dashed line B-B' in FIG. 3.

Next, as illustrated in FIG. 8, the solder resist film 14 having openings 14A from which part of the wiring patterns 15 are exposed is formed in the lower surface of sealing resin 17 including the wiring patterns 15. The openings 14A formed in the solder resist film 14 are formed by adopting, for example, the above photolithography technique.

In addition, if necessary, after the openings 14A are formed, surface processing for preventing metal diffusion may be applied to the surfaces of the wiring patterns 15 exposed from the openings 14A.

Figure 9:
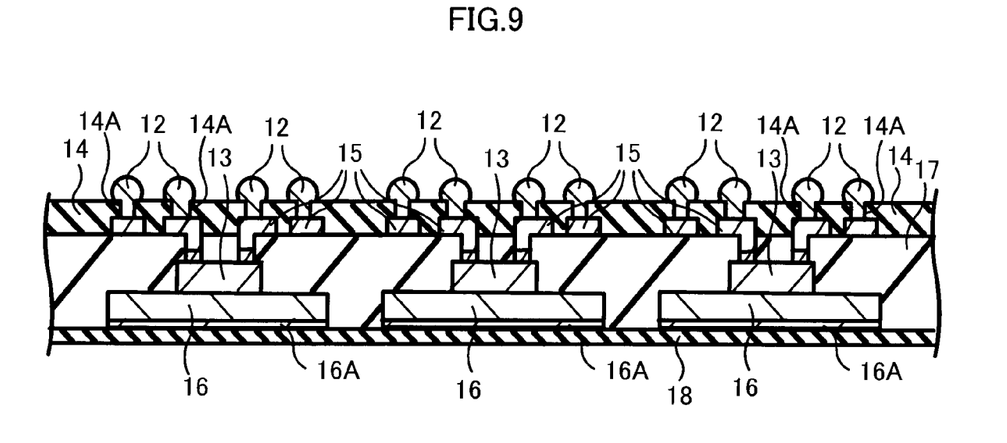
FIG. 9 is a view showing step for manufacturing the semiconductor device illustrated in FIG. 1 and FIG. 2, and a sectional view of semiconductor devices along a dashed line B-B' in FIG. 3.

Next, as illustrated in FIG. 9, the BGA balls 12 are formed in the openings 14A of the solder resist film 14. By forming the BGA balls 12 in the openings 14A of the solder resist film 14, the BGA balls 12 are connected to the wiring patterns 15.

The BGA balls 12 are formed by forming, for example, a solder material in the openings 14A of the solder resist film 14.

Figure 10:
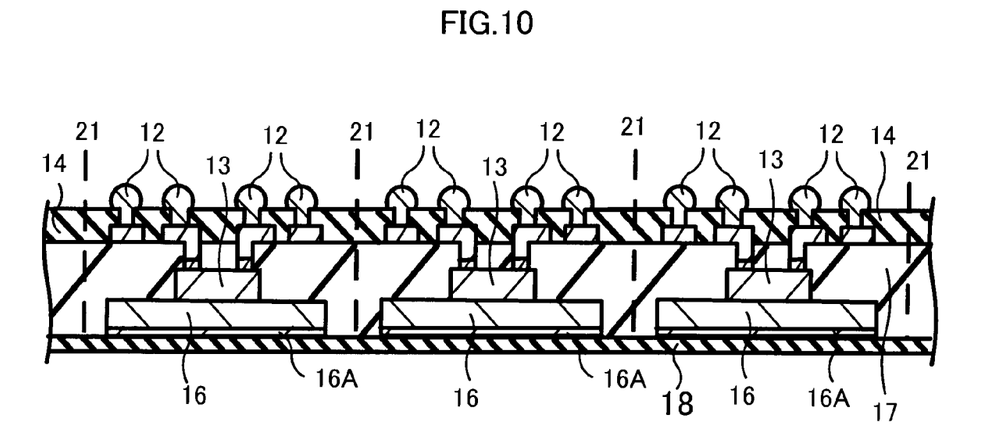
FIG. 10 is a view showing step for manufacturing the semiconductor device illustrated in FIG. 1 and FIG. 2, and a sectional view of semiconductor devices along a dashed line B-B' in FIG. 3.

Next, as illustrated in FIG. 10, the sealing resin 17 and solder resist film 14 are cut along the dicing line 21 such that the sealing resin 17 is left in the lateral surfaces of each base plate 16. According to the dicing, a plurality of semiconductor chips 13 integrated by the sealing resin 17 are individually divided. In addition, the dicing line 21 is a line around each base plate 16 and above the sealing resin 17 below each base plate 16.

Figure 11:
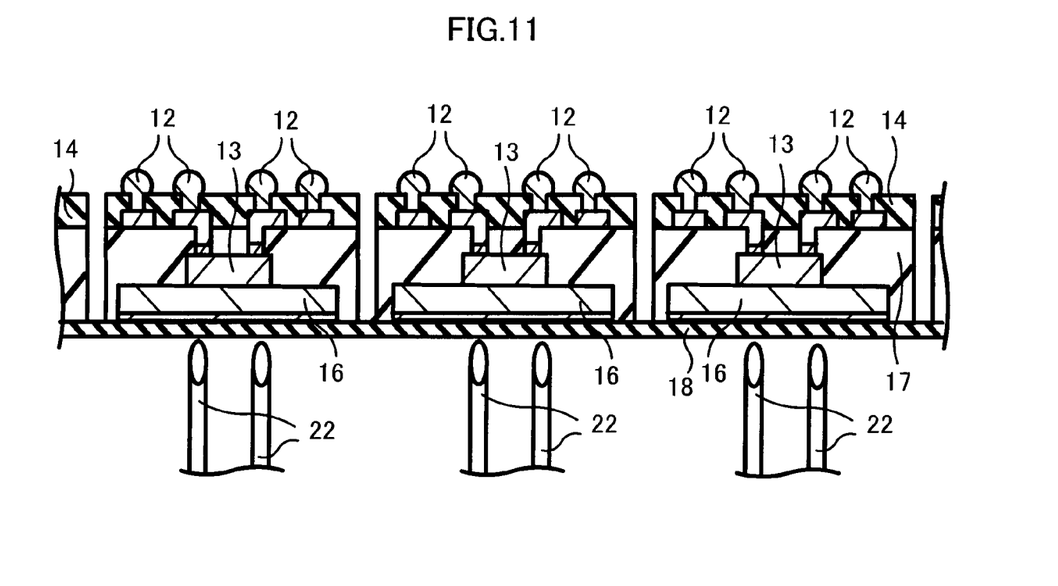
FIG. 11 is a view showing step for manufacturing the semiconductor device illustrated in FIG. 1 and FIG. 2, and a sectional view of semiconductor devices along a dashed line B-B' in FIG. 3.

Finally, as illustrated in FIG. 11, the semiconductor chips 13 covered by the sealing resin 17 are peeled off from the support film 18. The method for peeling off the semiconductor chips 13 from the support film 18 adopts, for example, a push-up method. The push-up method includes peeling off the semiconductor chips 13 from the support film 18 by pushing up the base plates 16 by means of push-up pins 22 such that the push-up pins 22 penetrate the support film 18.

By peeling off from the support film 18 the semiconductor chips 13 covered by the sealing resin 17, the semiconductor devices 11 illustrated in FIG. 1 and FIG. 2 are formed.

As described above, with the method for manufacturing the semiconductor devices 11 according to the first embodiment, the base plates 16 are individually divided in advance. Therefore, when a plurality of semiconductor devices 11 including the semiconductor chips 13 and base plates 16 are individually divided, it is not necessary to cut the base plates 16. Consequently, it is possible to collectively form the semiconductor devices 11 without decreasing the yield.

Further, in the semiconductor device 11 manufactured by this method, the lower surface and lateral surfaces of the base plate 16 are covered by the sealing resin 17. Consequently, it is possible to suppress corrosion of the base plate 16 by forming a plated layer 16A on the upper surface of the base plate 16.

Second Embodiment

Figure 12:
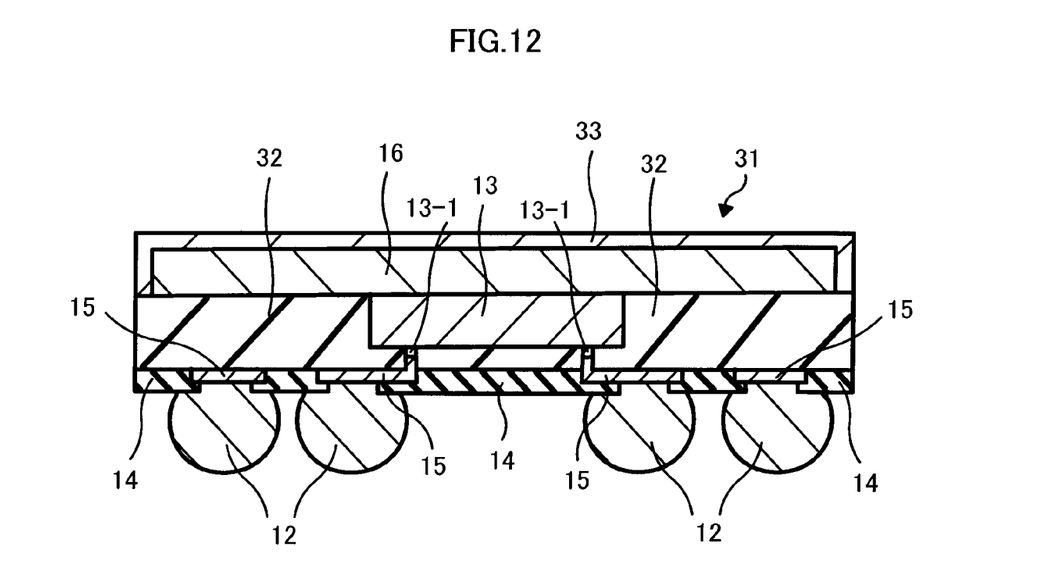
FIG. 12 is a sectional view of a semiconductor device formed by a method for manufacturing a semiconductor device according to the second embodiment of the present invention, and corresponds to FIG. 2.

Next, a method for manufacturing a semiconductor device according to the second embodiment will be described with reference to FIG. 12. FIG. 12 is a sectional view of a semiconductor device formed by the method for manufacturing the semiconductor device according to the second embodiment of the present invention, and corresponds to FIG. 2. The plan view showing this semiconductor device from the lower surface side is the same as FIG. 1. In FIG. 12, the same parts as in the semiconductor device 11 illustrated in FIG. 2 will be assigned the same reference numerals, and description thereof will be omitted.

As illustrated in FIG. 12, the semiconductor device 31 differs from the semiconductor device 11 illustrated in FIG. 2 in that the sealing resin 32 is not formed in the lateral surfaces of the base plates 16. That is, the semiconductor device 31 is a device in which the semiconductor chip 13 is sealed by the sealing resin 32 which contacts the lower surface of the base plate 16.

In the semiconductor device 31, the upper surface and lateral surfaces of the base plate 16 are exposed from the sealing resin 32. Hence, in case the base plate 16 is made of a corrosion-prone material, for example, a plated layer 33 including, for example, gold is preferably formed on the upper surface and lateral surfaces of the base plate 16.

The semiconductor device 31 is formed as follows. That is, first, the sealing resin 32 is formed in the lower surface of the support film 18 according to the steps illustrated in FIG. 3 to FIG. 6.

Next, part of the sealing resin 32 is removed by etching such that the lateral surfaces of the base plate 16 are exposed (the sealing resin 32 is not left in the lateral surfaces of the base plate 16) to form gaps 34. These gaps 34 are formed to omit the cutting step illustrated in FIG. 10.

Figure 13:
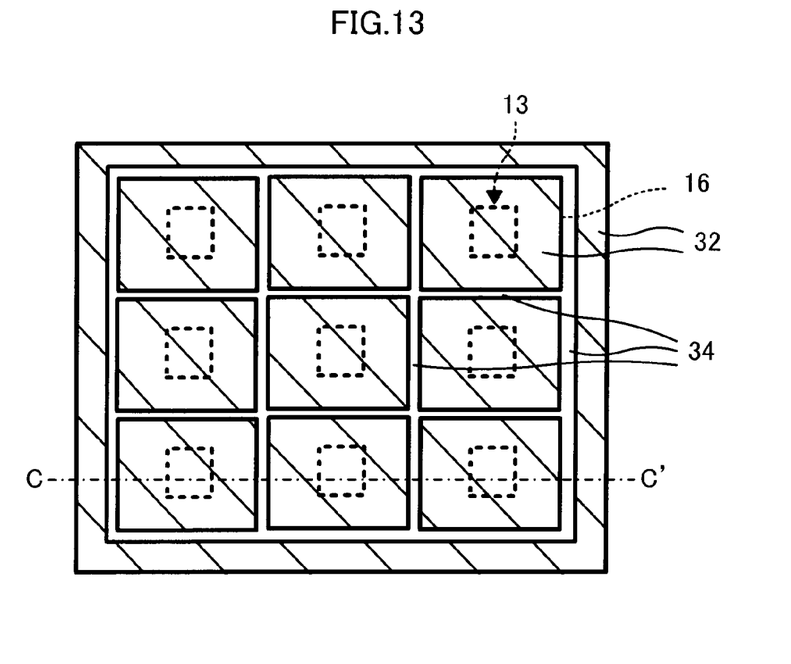
FIG. 13 is a view showing manufacturing step of the semiconductor device formed by the method for manufacturing the semiconductor device according to the second embodiment of the present invention, and a plan view showing from a lower surface side the semiconductor devices.
Figure 14:
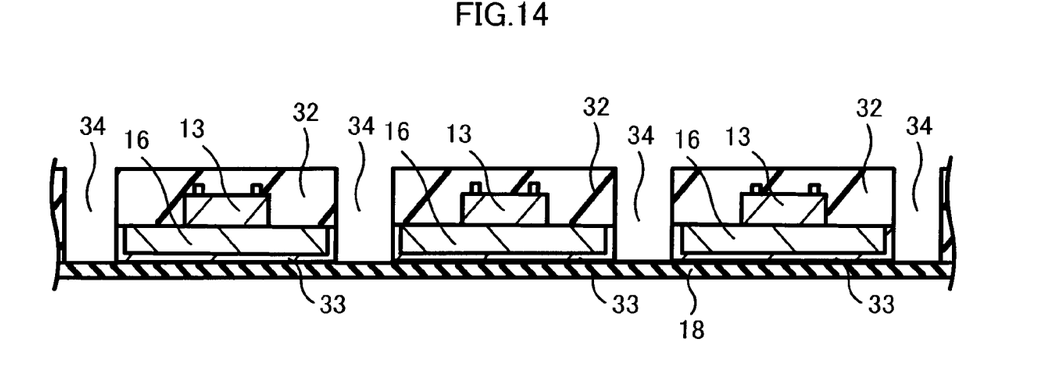
FIG. 14 is a view enlarging part of the sectional surface along a dashed line C-C' of FIG. 13.

FIG. 13 is a plan view showing from the lower side the sealing resin 32 after part of the sealing resin 32 is removed by etching. FIG. 14 is a view enlarging part of the sectional surface along the dashed line C-C' of FIG. 13.

As illustrated in FIG. 13 and FIG. 14, by removing the sealing resin 32 around and below each base plate 16, the gaps 34 from which all lateral surfaces of the base plate 16 are exposed are formed. After the gaps 34 are formed in the sealing resin 32, the semiconductor device 31 illustrated in FIG. 12 can be formed according to the steps illustrated in FIG. 7 to FIG. 11. A plurality of semiconductor chips 31 are already divided by forming the gaps 34, and therefore the cutting step illustrated in FIG. 10 is not necessary.

In the steps illustrated in FIG. 7 and FIG. 8, the metal which is used for the wiring patterns 15 and the material which is used for the solder resist film 14 are also formed in the gaps 34 of the sealing resin 32. In the gaps 34, when materials which are used for the wiring patterns 15 and solder mark film 14 are formed, each material formed in the gaps 34 only need to be removed by the etching step when the wiring patterns 15 and solder resist film 14 are formed.

In the method for manufacturing the semiconductor devices 31 according to the second embodiment, the step of cutting the sealing resin 32 and solder resist film 14 is not necessary. Consequently, the method for manufacturing the semiconductor devices 31 according to the second embodiment can more easily divides the semiconductor devices 31 than the method for manufacturing the semiconductor devices 11 according to the first embodiment.

Further, with the semiconductor device 31 manufactured by this method, the lower surface of the base plate 16 is covered by the sealing resin 32. Consequently, by forming the plated layers 33 on the upper surface and lateral surfaces of the base plate 16, corrosion of the base plate 16 is suppressed.

Figure 15:
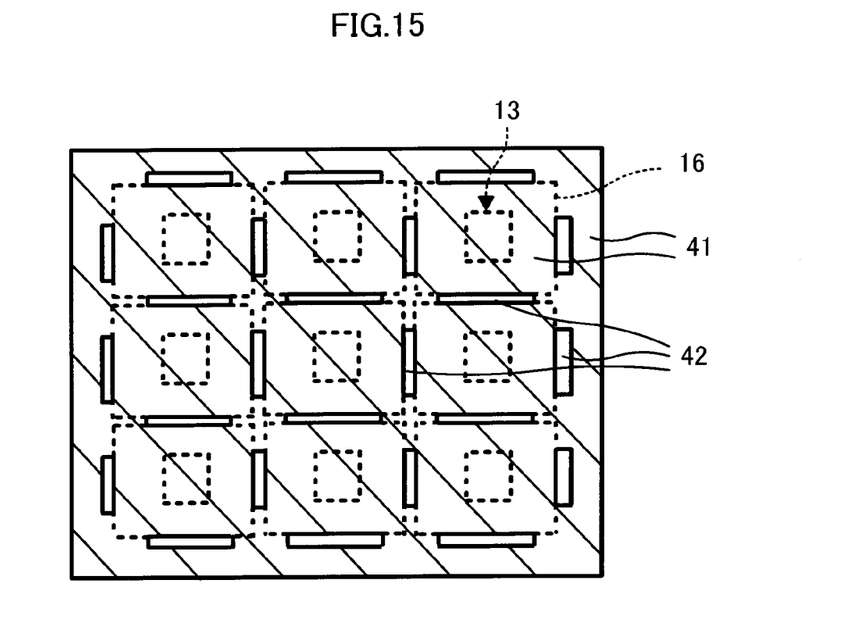
FIG. 15 is a plan view illustrating a modified example of the manufacturing step illustrated in FIG. 13.

In addition, with the method for manufacturing the semiconductor device according to the second embodiment, as illustrated in FIG. 13, the gaps 34 from which all lateral surfaces of the base plate 16 are exposed are formed. However, gaps may be formed such that part of the lateral surfaces of the base plate 16 are exposed. FIG. 15 is a plan view showing from the lower side the sealing resin 41 from which part of the sealing resin 41 is removed by etching. As illustrated in FIG. 15, the gaps 42 may be formed such that the sealing resin 41 on the corner parts of the base plate 16 is left. By forming the gaps 42 as illustrated in FIG. 15, it is possible to stably grow plating on a metal for forming the wiring patterns 15.

In case the method of forming gaps 42 in the sealing resin 41 is adopted, the step of cutting the sealing resin 41 illustrated in FIG. 10 is necessary. However, the base plates 16 do not need to be cut, so that it is possible to collectively form a plurality of semiconductor devices 31 including the semiconductor chips 13 and base plates 16 without decreasing the yield.

Further, although the step of cutting the sealing resin 41 is required, the amount of the sealing resin 41 to be cut is less than the amount of the sealing resin 17 to be cut in the method for manufacturing the semiconductor devices 11 according to the first embodiment. Consequently, it is possible to more easily divide the semiconductor devices 31.

Further, in case the method of forming the gaps 42 in the sealing resin 41 is adopted, the gaps 42 are formed in the sealing resin 41 such that part of the sealing resin 41 is left. Consequently, compared to a case where the gaps 33 are formed in the sealing resin 32 as illustrated in FIG. 13 and FIG. 14, it is possible to stably grow plating on a metal for forming the wiring patterns 15.

In addition, even the semiconductor device 31 manufactured by adopting the method of forming the gaps 42 in the sealing resin 41 can suppress corrosion of the base plate 16 by forming the plated layer 33 in the upper surface and lateral surfaces of the base plate 16.

Third Embodiment

Figure 16:
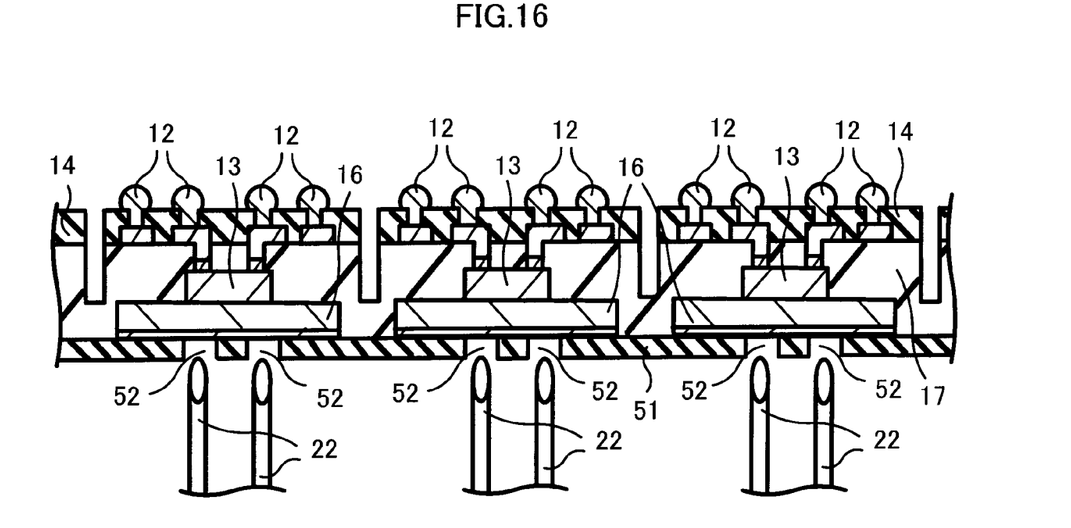
FIG. 16 is a sectional view showing a method for manufacturing a semiconductor device according to the third embodiment of the present invention, and corresponds to FIG. 11.

Next, a method for manufacturing a semiconductor device according to the third embodiment will be described with reference to FIG. 16. The structure of the semiconductor device manufactured by the method for manufacturing the semiconductor device according to the third embodiment, is the same as the structures illustrated in FIG. 1 and FIG. 2 and therefore description thereof will be omitted, and the steps different from the method for manufacturing the semiconductor devices 11 according to the first embodiment will be described.

The method for manufacturing the semiconductor device according to the third embodiment differs from the method for manufacturing the semiconductor devices 11 according to the first embodiment, in the cutting step illustrated in FIG. 10. FIG. 16 is a sectional view showing the method for manufacturing the semiconductor device according to the third embodiment of the present invention, and corresponds to FIG. 11. As illustrated in FIG. 16, with the method for manufacturing the semiconductor device according to the third embodiment, the sealing resin 17 is cut such that part of the sealing resin 17 is left in the lower surface of the support film 51 without completely cutting the sealing resin 17 around and below each base plate 16. As a result of this, part of the sealing resin 17 around and below a plurality of base plates 16 is left in the lower surface of the support film 51. In addition, the support film 51 used in this method includes openings 52 through which the push-up pins 22 adopted in the step of peeling off from the support film 51 the semiconductor chips 13 covered by the sealing resin 17 penetrate.

After cutting part of the sealing resin 17 such that part of the sealing resin 17 is left in the lower surface of the support film 51, the semiconductor chips 13 covered by the sealing resin 17 by the push-up method are peeled off from the support film 51. When the semiconductor chips 13 are peeled off from the support film 51, the base plates 16 need to be pushed up upward by the push-up pins 22 to an extent that the sealing resin 17 left in the lower surface of the support film 51 is torn off. According to the above method, it is possible to form the same semiconductor devices 11 as in FIG. 1 and FIG. 2.

Even with the method for manufacturing the semiconductor device according to the third embodiment described above, the base plates 16 need not be cut. Consequently, it is possible to collectively form a plurality of semiconductor devices 11 including the semiconductor chips 13 and base plates 16 without decreasing the yield.

Further, according to the method for manufacturing the semiconductor device according to the third embodiment, in the step of cutting the sealing resin 17, the sealing resin 17 is cut such that part of the sealing resin 17 is left in the lower surface of the support film 51. Consequently, when the sealing resin 17 is cut, it is possible to suppress the support film 51 from being damaged. Further, the push-up pins 22 push up the base plates 16 passing the openings 52 provided in advance.

Consequently, it is possible to suppress the push-pins 22 from damaging the support film 51. Consequently, with the method for manufacturing the semiconductor device according to the third embodiment, it is possible to utilize again the support film 51.

In addition, the semiconductor device 11 manufactured by the method for manufacturing the semiconductor device according to the third embodiment, is the same as the semiconductor device 11 manufactured by the method for manufacturing the semiconductor device according to the first embodiment. Consequently, the semiconductor device 11 manufactured by the method for manufacturing the semiconductor device according to the third embodiment can suppress corrosion of the base plate 16 by forming the plated layer 16A in the upper surface of the base plate 16.

While certain embodiments have been described, these embodiments have been presented by way of example only, and are not intended to limit the scope of the inventions. Indeed, the novel semiconductor device and the method for manufacturing the semiconductor device described herein may be embodied in a variety of other forms: furthermore, various omissions, substitutions and changes in the form of the semiconductor device and the method for manufacturing the semiconductor device described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising steps of:
    pasting to a support body a plurality of base plates as heat sinks on which respective semiconductor chips are mounted, at a predetermined interval;
    forming a sealing resin in the support body such that the sealing resin covers the plurality of base plates and a plurality of the semiconductor chips;
    forming wiring patterns in the sealing resin such that the wiring patterns are electrically connected to the respective semiconductor chips;
    forming a wiring protective film in the sealing resin including the wiring patterns such that part of the wiring patterns are exposed;
    forming external electrodes such that the external electrodes contact the wiring patterns exposed from the wiring protective film;
    individually dividing the plurality of the semiconductor chips integrated by the sealing resin by cutting the sealing resin and the wiring protective film; and
    peeling off from the support body the plurality of semiconductor chips and the base plates covered by the sealing resin, after individually dividing the plurality of the semiconductor chips.

2. The method for manufacturing the semiconductor device according to claim 1, wherein the step of cutting the sealing resin includes a step of cutting the sealing resin such that the sealing resin is left in all lateral surfaces of the base plates.

3. The method for manufacturing the semiconductor device according to claim 1, wherein the base plates are made of one of a stainless-steel, a copper and a ceramic.

4. The method for manufacturing the semiconductor device according to claim 1, wherein a plated layer is formed in an upper surface of the base plate.

5. A method for manufacturing a semiconductor device comprising steps of:
    pasting to a support body a plurality of base plates as heat sinks on which respective semiconductor chips are mounted, at a predetermined interval;
    forming a sealing resin in the support body such that the sealing resin covers the plurality of base plates and a plurality of the semiconductor chips;
    forming in the sealing resin gaps from which a part of each of lateral surfaces of the base plates are exposed;
    forming wiring patterns in the sealing resin such that the wiring patterns are electrically connected to the respective semiconductor chips;
    forming a wiring protective film in the sealing resin including the wiring patterns such that part of the wiring patterns are exposed;
    forming external electrodes such that the external electrodes contact the wiring patterns exposed from the wiring protective film;
    individually dividing the plurality of the semiconductor chips integrated by the sealing resin by cutting the sealing resin and the wiring protective film; and
    peeling off from the support body the plurality of semiconductor chips and the base plates covered by the sealing resin, after individually dividing the plurality of the semiconductor chips.

6. The method for manufacturing the semiconductor device according to claim 5, wherein the base plates are made of one of a stainless-steel, a copper and a ceramic.

7. The method for manufacturing the semiconductor device according to claim 5, wherein a plated layer is formed in an upper surface and the lateral surfaces of the base plate.

* * * * *